US007251756B2

(12) United States Patent
Anand et al.

(10) Patent No.: US 7,251,756 B2
(45) Date of Patent: Jul. 31, 2007

(54) METHOD AND APPARATUS FOR INCREASING FUSE PROGRAMMING YIELD THROUGH PREFERRED USE OF DUPLICATE DATA

(75) Inventors: Darren Lane Anand, Essex Junction, VT (US); Michael Richard Ouellette, Westford, VT (US); Michael Anthony Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 282 days.

(21) Appl. No.: 10/908,033

(22) Filed: Apr. 26, 2005

(65) Prior Publication Data

US 2006/0239088 A1 Oct. 26, 2006

(51) Int. Cl.
*G11C 29/00* (2006.01)
(52) U.S. Cl. .................................... 714/710; 714/718
(58) Field of Classification Search ............... 365/200, 365/225.7; 714/733, 710, 718; 438/132; 326/38
See application file for complete search history.

(56) References Cited

U.S. PATENT DOCUMENTS

| 6,246,617 | B1 * | 6/2001 | Urakawa ................. 365/200 |
| 6,651,202 | B1 * | 11/2003 | Phan ........................ 714/733 |
| 6,757,204 | B2 * | 6/2004 | Di Ronza et al. ........... 365/200 |
| 6,768,694 | B2 * | 7/2004 | Anand et al. ............ 365/225.7 |
| 6,913,954 | B2 * | 7/2005 | Kothandaraman .......... 438/132 |
| 7,031,218 | B2 * | 4/2006 | Hoffmann et al. ....... 365/225.7 |
| 7,071,729 | B2 * | 7/2006 | Hoffmann .................... 326/38 |
| 7,174,486 | B2 * | 2/2007 | Adams et al. .............. 714/710 |

FOREIGN PATENT DOCUMENTS

EP          0860878 A2     8/1998

OTHER PUBLICATIONS

"Yield Enhancement by Optimum Use of Redundant Bit Lines," IBM TDB, vol. 32, No. 4A, Sep. 1989, pp. 387-388.

* cited by examiner

*Primary Examiner*—David Ton
(74) *Attorney, Agent, or Firm*—W. R. Harding; Anthony V. S. England

(57) ABSTRACT

Integrated circuit memory is tested to discover defective memory elements. To replace the defective memory elements, spare memory elements are selected and a string is generated to indicate which ones of the spares replace which ones of the defective memory elements. The number of bits of the string depend upon how many of the memory elements are defective. Although a certain number of the memory elements are defective, which determines the number of the string bits, nevertheless, a number of fuses to program on the integrated circuit is determined responsive to how many fuses are available for programming relative to the number of the binary string bits. That is, if more fuses are available than a certain threshold number relative to the number of string bits (as is preferred), then more than the threshold number are programmed. If not, then only that certain threshold number of fuses are programmed.

30 Claims, 9 Drawing Sheets

METHOD AND APPARATUS FOR INCREASING FUSE PROGRAMMING YIELD THROUGH PREFERRED USE OF DUPLICATE DATA

CROSS-REFERENCE TO RELATED APPLICATION

This application is related to the following U.S. patents, which are hereby incorporated herein by reference:

U.S. Pat. No. 6,856,569, Nelson, et al., Feb. 15, 2005, "Method and system for merging multiple fuse decompression serial bitstreams to support auxiliary fuseblow capability;" and U.S. Pat. No. 6,768,694, Anand, et al., Jul. 27, 2004, "Method of electrically blowing fuses under control of an on-chip tester interface apparatus."

BACKGROUND OF THE INVENTION

1. Field of the Invention

The present invention generally relates to testing and replacing defective memory elements through the use of fuses. More specifically, the invention relates to encoding of a bit string in the fuses and to subsequent decoding of the fuses.

2. Description of the Related Art

The customization, test and repair of complex integrated circuits in an automated manufacturing test environment are challenging problems. One issue that arises in this context is the need to automatically repair defective memory elements in large arrays of memory on integrated circuit chips. In the past, metal fuses have been used for such repair. More recently, electrically programmed fuses ("e-fuses") have been developed.

E-fuses are currently manufactured as polysilicon links. Such an e-fuse has two intended logic states. To obtain a logical "1" state, an e-fuse is "programmed" (also referred to as blown, opened, open circuited, etc.), such as by applying a pulse of 10 mA for 200 microseconds. This current disturbs the polysilicon link, dramatically increasing its resistance. For a relatively lower resistance, logical "0" state, an e-fuse is not subjected to such a "programming" current, and, thus, the polysilicon link is left intact. The logical state of an e-fuse can generally be detected by a sense circuit.

E-fuses are significantly smaller than metal fuses. This is good, because as devices decrease in size, it becomes possible to put more devices onto an integrated circuit chip. Thus, the trend is to larger and larger memory arrays. Because e-fuses have fewer mechanical dependencies, they can even shrink in size as device technology and fabrication processes develop. Consequently, more and more e-fuses are being included on chips to repair increasing numbers of defective memory elements.

One difficulty with e-fuses is that their programming is not entirely reliable. That is, sometimes a programming current does not change the resistance of an e-fuse as much as intended, so that the supposedly programmed e-fuse does not clearly appear to have been programmed when sensed by a sense circuit. This unreliability presents a particularly significant problem, because this kind of failure in the programming of even a single e-fuse on a chip, if uncorrectable, may spoil the chip.

SUMMARY OF THE INVENTION

The present invention addresses the foregoing problem. According to one form of the invention, in an integrated circuit having spare memory elements for replacing defective memory elements, fuses are programmed to replace defective memory elements of the integrated circuit. To do this, certain memory elements of the integrated circuit are tested to discover defective memory elements among the certain memory elements. To replace the memory elements that are discovered to be defective, spare memory elements are selected. A binary string is generated to indicate which ones of the spare memory elements replace which ones of the defective memory elements. The binary string has a number of bits, the number being dependent upon how many of the memory elements are discovered to be defective. A determination is also made as to how many fuses on the integrated circuit are available to program for storing a nonvolatile record of the binary string.

Although a certain number of the memory elements are determined to be defective, which determines the number of the binary string bits, nevertheless, the number of fuses to program on the integrated circuit is determined in response to how many fuses are available for programming relative to the number of the binary string bits. That is, if more fuses are available than a certain threshold number relative to the number of binary string bits (as is preferred), then more than the threshold number of fuses are programmed. If not, then only that certain threshold number of fuses are programmed. Thus, even given two cases in which the number of binary bits to be recorded by the fuses is the same, in one case in which more fuses are available, the number of fuses programmed is more, and, in another case in which less fuses are available, the number programmed is less.

In one alternative, if it is determined that at least twice as many of the fuses are available as the number of bits of the string then each bit of the binary string is recorded in two fuses. Similarly, according to this alternative, if it is determined that there are less than twice as many of the fuses are available as the number of bits of the string then each bit of the binary string is recorded in one fuse, i.e., one fuse per bit, instead of two fuses per bit.

In another alternative, if it is determined that there are at least two of the fuses available for recording one of the bits of the binary string (but not necessarily enough fuses to record all of the bits in this manner), at least that one bit is recorded in two fuses.

In another feature of the invention, a format indication is also recorded, such as in a fuse, so that it may be determined later how the bits of the string have been recorded in the fuses, i.e., what format was used. That way, when reading the recorded string from the fuses, if it is determined two fuses were recorded for one string bit then even if only one of two fuses for a string bit has a certain state (for example a logical "1" state), the bit is nevertheless read as having that state.

Other variations, objects, advantages, and forms of the invention will become apparent upon reading the following detailed description and upon reference to the accompanying drawings.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 1A:
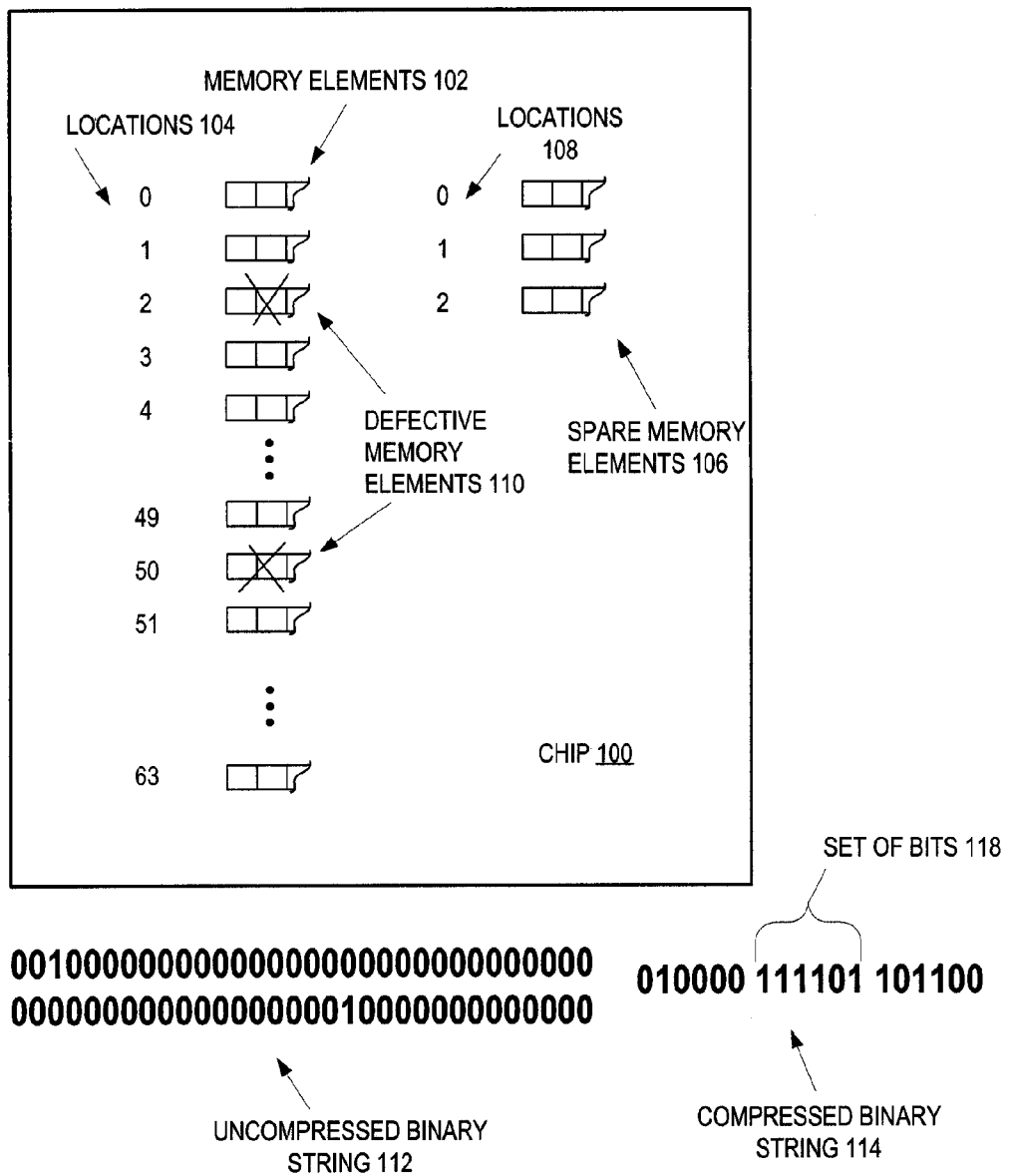
FIG. 1A illustrates an integrated circuit chip having memory elements and spare memory elements and also illustrates the use of a binary string and a compressed string for mapping spare memory elements to defective memory elements, according to an embodiment of the present invention.

Referring now to FIG. 1A, an integrated circuit chip 100 is shown, according to an embodiment of the present invention. For simplicity of explanation, chip 100 is shown with only sixty-four memory elements 102. (It should, of course, be understood that a preferred chip 100 may have more on the order of tens of thousands memory elements 102.) Each memory element 102 has a number of memory cells, as shown. That is, each memory element 102 may be a word line, each having about one thousand memory cells, for example. The sixty-four memory elements 102 are shown at locations 104, numbered 0 through 63. Chip 100 also includes four spare memory elements 106, at locations 108, numbered 0 through 3, for replacing defective ones of memory elements 102. (It should, of course, be understood that a preferred chip 100 may have more on the order of several thousand spare memory elements 106.)

In the illustrated instance, testing of memory elements 102 has revealed that the ones of memory elements 102 at locations 104 numbered 2 and 50 are defective elements 110, as indicated. Spare memory elements 106 at locations 108 numbered 0 and 1 are respectively selected to replace the memory elements 102 at locations 104 numbered 2 and 50 that are defective.

An uncompressed binary string 112 is generated to indicate which ones of spare memory elements 106 have been selected for replacing which respective ones of defective memory elements 110. That is, in the illustrated instance, uncompressed binary string 112 has a bit for each spare memory element 106, each bit corresponding to one of the memory elements 102. (Note that string 112 is shown on two lines can FIG. 1A. It should be understood, however, that this is merely due to space limitations on the drawing.) The absolute location of a bit in string 112 determines correspondence between the bit and a memory element 102, i.e., the first bit corresponds to the memory element 102 at address 104 numbered 0, the second bit corresponds to the memory element 102 at address 104 numbered 1, etc. The value of each bit of string 112 indicates whether its corresponding memory element 102 is defective, with a value of "1" indicating defective, and a value of "0" indicating not defective. In the illustrated instance, since the third and fifty-first memory elements 102 are defective, the third and fifty-first bits of string 112 are "1's" and the rest of the bits are "0's."

As stated above, if a memory element 102 is defective, a spare memory element 106 is selected to replace it and the absolute location of a "1" bit in string 112 indicates the location of the memory element 102 that is defective. The location of a spare memory element selected to replace the defective memory element is indicated by the relative location of a "1" bit in string 112. That is, if a bit is the first bit in string 112 that has a value "1," this indicates the bit corresponds to the first spare memory element 106, i.e., the memory element 106 having address 108 numbered 0. If a bit is the second bit in string 112 that has a value "1," this indicates the bit corresponds to the second spare memory element 106, i.e., the memory element 106 having address 108 numbered 1.

Thus, in the embodiment of the invention shown in FIG. 1A, the combination of the absolute locations of "1" bits in string 112 and the position of those "1" bits relative to other "1" bits in string 112 indicates which ones of spare memory elements 106 have been selected to replace which ones of memory elements 102. And since the third bit of string 112 is the first "1" bit, this indicates the first spare memory element 106 has been selected to replace the third memory element 102. Likewise, since the fifty-first bit of string 112 is the second "1" bit, this indicates the second spare memory element 106 has been selected to replace the fifty-first memory element 102.

Note that a chip 100 may have thousands or even tens of thousands of memory elements 104. Such a chip 100 will have hundreds or thousands of spare memory elements 106. If such a chip 100 does not have many defective memory elements 110, the chip 100 may have hundreds or thousands of spare memory elements 106 that are not selected for use to replace defective memory elements 110. Thus, depending on how many defective memory elements 110 a chip 100 has, the chip may have an uncompressed binary string 112 with hundreds or thousands of "0" bits. Such a string 112 may be advantageously compressed to a smaller, compressed string 114.

In the embodiment of the invention illustrated in FIG. 1A, string 112 is compressed to the value shown for compressed string 114 by setting out, in string 114, a sequence of sets 118 of six bits indicating the number of "0" bits in string 112 before each instance of a "1" bit or else to the end of string 112. Thus, in the illustrated example, the first set 118 of bits in string 114 is "010000," which is a binary value indicating that there are two "0" bits in string 112 before the first "1" bit. The next set 118 of bits in string 114 is "111101," indicating that there are forty-seven "0" bits in string 112 after the first "1" before the next "1" bit. The next set 118 of bits in string 114 is "101100," indicating that there are thirteen "0" bits in string 112 from after the second "1" to the end of string 112.

While the chip 100 of FIG. 1A is for a very simple embodiment of the invention, it serves well to illustrate that a binary string 112 may be used to map correspondence between spare memory elements 106 and defective memory elements 110, i.e., to indicate which spare memory elements 106 has been selected to replace which memory element 102. Also, FIG. 1A serves well to illustrate that the binary string 112 may be compressed into a compressed string 114.

Note also that FIG. 1A serves to illustrate that the number of bits in compressed string 114 depends upon how many of the memory elements 102 are defective. That is, in the example shown, since there were two defective memory elements 110, compressed string 114 had only eighteen bits. If there had been only one defective memory element 110, compressed string 114 could have been merely twelve bits. In the illustrated embodiment of the invention, string 114 may generally be compressed to a number of bits=6+(6/number of defective memory elements 110). In certain special cases, string 114 may be compressed even more. For example, if the first memory element 102 was one of only two defective elements 110, the compressed string 114 could also be merely 12 bits. And if the last memory element 102 was the only defective memory element 110, the compressed string 114 could be merely six bits.

Figure 1B:
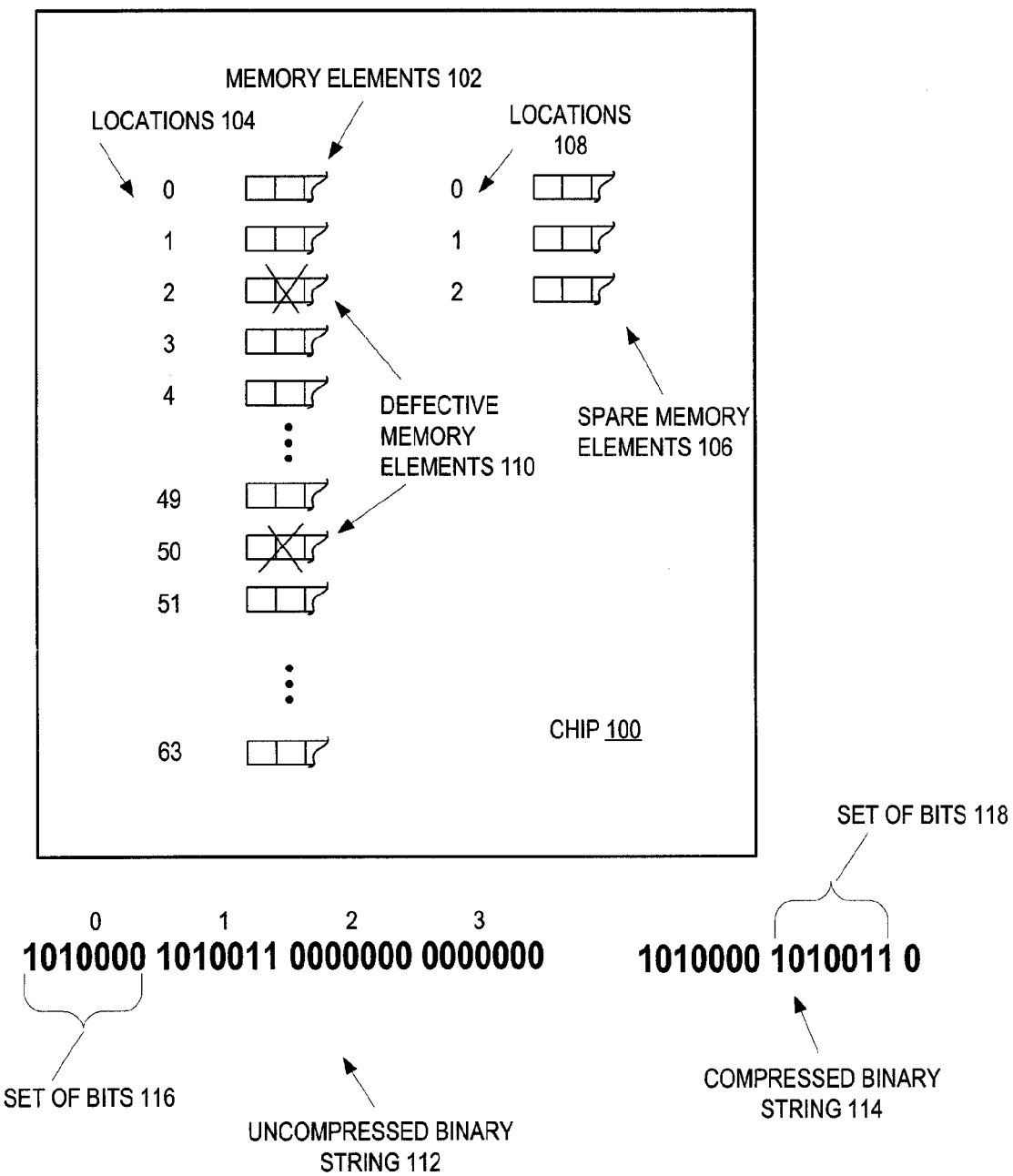
FIG. 1B illustrates another arrangement for mapping memory elements and compressing a string, according to an embodiment of the present invention.

Referring now to FIG. 1B, another example of chip 100 and strings 112 and 114 is shown, according to another embodiment of the present invention. In this example, once again, the third and fifty-first memory elements 102, i.e., at locations 104 numbered 2 and 50, are discovered to be defective and the first and second spare memory elements 106 are selected to replace them. Again, uncompressed binary string 112 is generated to indicate which ones of spare memory elements 106 have been selected for replacing which respective ones of defective memory elements 110.

In the embodiment of the invention illustrated in FIG. 1B, uncompressed binary string 112 has a set 116 of seven bits for each spare memory element 106, with the first bit of each set 116 indicating whether the spare memory element 106 corresponding to that set 116 has been selected to replace a defective memory element 110. Thus, in the illustrated instance, since two of memory elements 102 were discovered to be defective, sets 116 of bits numbered 0 and 1 in uncompressed binary string 112 have their first bits set to "1," and the set 116 of bits numbered 2 in the uncompressed binary string 112 has its first bit set to "0." Also, the next six bits in each set 116 indicates the address 104 of the corresponding memory element 102 that the spare memory element 106 for that set 116 replaces. Thus, in the illustrated instance, since the first spare memory element 106 has been selected to replace the memory element 102 at address 104 numbered 2, the second through seventh bit of the set 116 of bits numbered 0 has the value "010000," and since the second spare memory element 106 has been selected to replace the memory element 102 at address 104 numbered 50, the second through seventh bit of the set 116 of bits numbered 1 has the value "010011." Since the third spare memory element 106 has not been selected to replace a memory element 102, the third through seventh bit of the set 116 of bits numbered 2 has the value "000000." Likewise, since the fourth spare memory element 106 has not been selected to replace a memory element 102, the third through seventh bit of the set 116 of bits numbered 3 has the value "000000."

In FIG. 1B, string 112 is compressed to string 114 as follows. To indicate that the first spare memory element 106 is used, i.e., the element 106 at address 108 numbered 0, the first bit of string 114 is set to "1." Since that first bit equals "1," the next six bits indicate the address 104 of the memory element 102 that the first spare memory element 106 has been selected to replace. To indicate that the second spare memory element 106 is used, i.e., the element 106 at address 108 numbered 1, the eighth bit of string 114, i.e., the first bit in the second set 118 of seven bits, is also set to "1." Since that bit equals "1," the next six bits indicate the address 104 of the memory element 102 that the second spare memory element 106 has been selected to replace.

To indicate that the third spare memory element 106 is not used, the fifteenth bit of string 114, i.e., the first bit in what would be a third set 118 of eight bits, is set to "0." There is no need for an additional seven bits in the compressed string 114 for the third spare memory element 106.

Further, there is not even a need for any bits at all in a fourth set 118 of bits for string 114 for the fourth spare memory element. That is, once the first bit of a set 118 of bits for string 114 is encountered having a value "0," it is understood that the string 114 has no more bits. In the embodiment of the invention illustrated in FIG. 1B, string 114 may generally be compressed to a number of bits=1+(8/number of defective memory elements 110).

Alternatively, to indicate that the third spare memory element 106 is not used, the string 114 may simply have no more bits after the second set 118 of bits. In this case, string 114 may generally be compressed to a number of bits=8/number of defective memory elements 110.

Figures 1C, 1D:
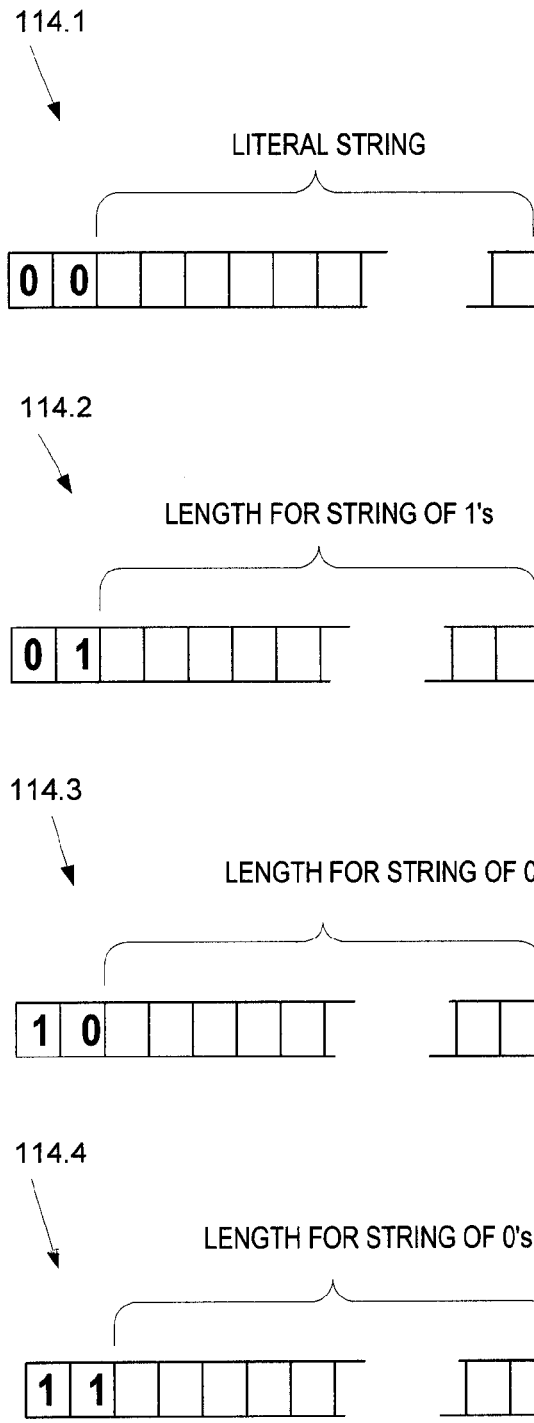
FIGS. 1C and 1D illustrate other ways of compressing a string, according to an embodiment of the present invention.

Referring now to FIG. 1C, another way of generating a compressed string is illustrated, according to another embodiment of the present invention in which the first two bits of the compressed string indicate whether and how the rest of the string is encoded. In a first instance of a compressed string shown, labeled string 114.1, the first two bits are both "0", indicating that string 114.1 is for a "literal string." String 114.1 is a fixed length, such as sixteen bits, for example, and all the predetermined number of bits after the first two are uncompressed, e.g., the third through sixteenth bits correspond one-to-one to fourteen of the bits of uncompressed string 112 (FIGS. 1A and 1B). In string 114.2, the first bit is "0" and the second bit is "1," indicating that the string is a "one-string" having some certain number of bits following the first two bits. For example, string 114.2 may always be nine bits long, that is, it may always have seven bits following its first two bits. The value of those seven bits indicates the length of a string of "0's" of uncompressed string 112. In string 114.3, the first bit is "1" and the second bit is "0," indicating that it is a "short-zero" string having a certain number of bits following the first two bits. For example, string 114.3 may also always be nine bits long, that is, it may always have seven bits following its first two bits. The value of those seven bits indicates the length of a string of "0's" of uncompressed string 112. In string 114.4, the first bit is "1" and the second bit is "0," indicating that it is a "long-zero" string and has a certain number of bits (a larger number than for string 114.3) following the first two bits. For example, string 114.4 may also always be sixteen bits long, that is, it may always have fourteen bits following its first two bits. The value of those fourteen bits indicates the length of a string of "0's" of uncompressed string 112.

FIG. 1D illustrates the manner in which a string may be compressed in accordance with the embodiment of FIG. 1C. The uncompressed binary string 112 of FIG. 1B is shown with its corresponding compressed binary string 114. In the illustrated embodiment, a literal string 114.1 has sixteen bits and a short zero string 114.3 has nine bits, as was also the case in FIG. 1C. The first portion 114.1 of string 114 is shown, which begins with "00," indicating the next fourteen bits are literally the same as the corresponding bits of the uncompressed string 112, i.e., "10100001010011." The next portion 114.3 of string 114 begins with "10," indicating that the value of the seven subsequent bits indicates the length of a string of zeros. Thus, those seven bits are "0111000," which has a value of fourteen, i.e., the number of "0's" following the "10100001010011" portion of string 112.

Figure 1E:
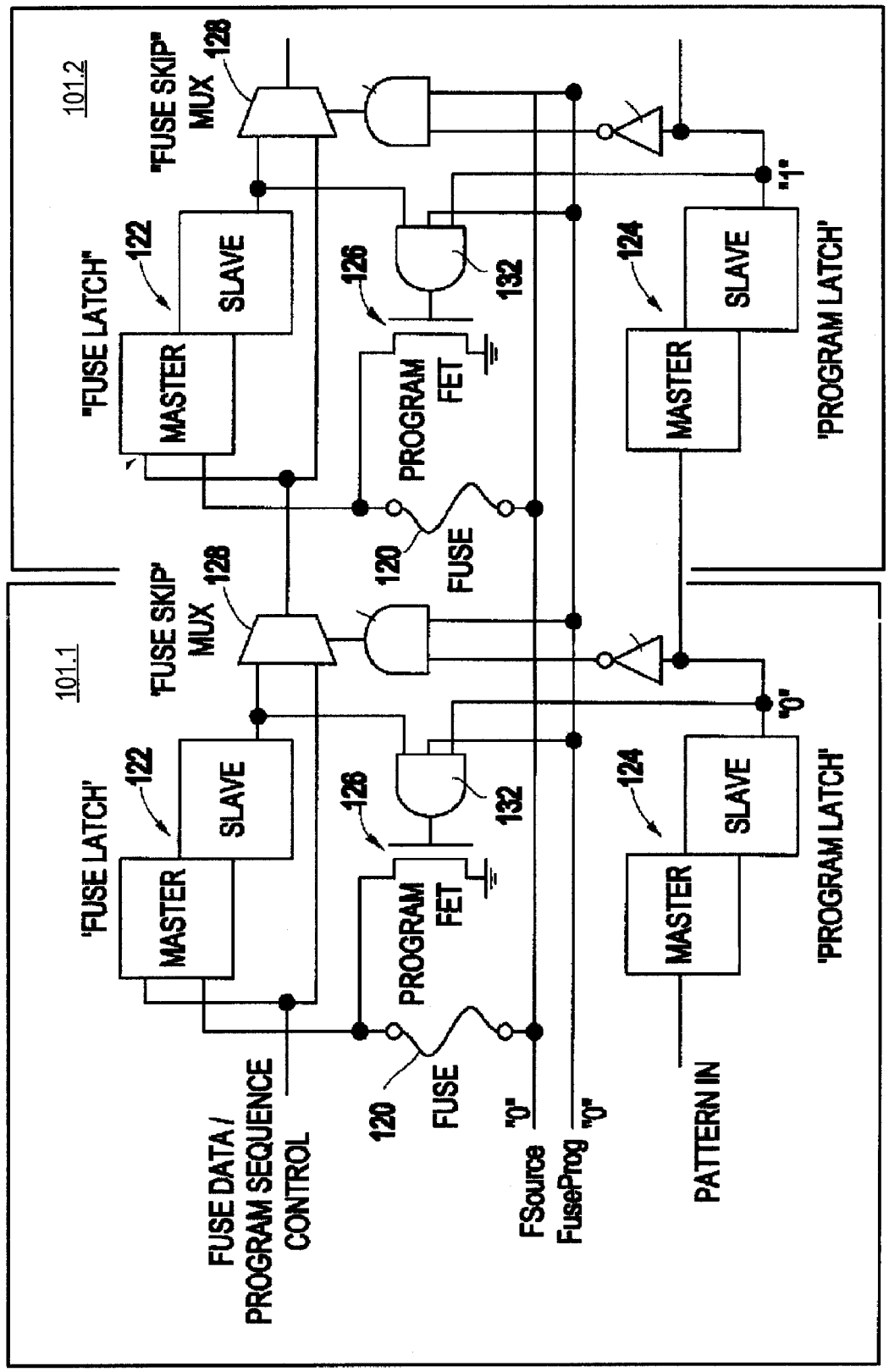
FIG. 1E illustrates, in a schematic diagram form, an e-fuse on the chip of FIGS. 1A and 1B, according to an embodiment of the present invention.

Referring now to FIG. 1E, two interconnected e-fuses 101 are shown, according to an embodiment of the present invention. Such e-fuses can be programmed to provide a nonvolatile record of the value of a compressed binary string, such as string 114 in FIGS. 1A and 1B (It should be understood, of course, that groups of e-fuses 101 are provided in an embodiment of the present invention, as will be described further herein below. FIG. 1E merely shows two e-fuses 101, in order to set out certain details. (For the most part, the following description concerns one of the e-fuses 101 depicted in FIG. 1E. It will be clear in the following when interconnections and interactions between e-fuses 101 are described.)

An e-fuse 101 includes a polysilicon fuse link 120 that has a first node coupled to a source bus FSource and a second node coupled to a conducting electrode of a program field-effect transistor ("FET") 126. The other conducting electrode of FET 126 is coupled to ground. The gate of FET 126 is coupled to the output of an AND circuit 132, so that in a programming mode if AND circuit 132 turns on FET 126, a programming current is sourced from FSource to ground through the fuse link 120 and the FET 126 conducting electrodes. Applying this current programs, i.e., blows, fuse link 120. Subsequently, when not in a programming mode, the FSource line may be grounded and the logical state of fuse link 120 can be detected by the fuse link's latch 122. That is, if the link 120 was not blown, the latch 122 input will be pulled to ground through the relatively low resistance link 120, indicating a logic "0," but if the link 120 was blown, the latch 122 input will not be pulled to ground through the relatively high resistance link 120, indicating a logic "1."

A FuseProg signal is applied to enable or disable programming of a number of e-fuses 101. In a series of e-fuses 101, fuse latches 122 are coupled from one latch 122 output to the next latch 122 input. Likewise, program latches 124 of respective e-fuses 101 in a fuse group are similarly coupled in series. Thus, bits of a program string of data may be shifted from one program latch 124 to the next, in sequence in response to a clock signal (not shown) at each latch 124. The program string is sequentially input via a "pattern in" line, as shown.

A logical "1" is sequentially shifted through the fuse latches 122, in order to enable programming of only one fuse link 120 per clock cycle. This single, logical "1" bit would be shifted by clock cycles from one latch 122 to the immediately succeeding latch 122 in a group of series-connected fuse latches 122, except that a fuse skip multiplexer ("mux") 128 is interposed between fuse latches 122. Mux 128 enables the logical "1" bit of the fuse control string to selectively skip any fuse latch 122 for which the associated program latch 124 does not also contain a logical "1," which provides a means to save tester time during fuse programming by avoiding spending time on a fuse that is not going to be programmed.

Figure 2:
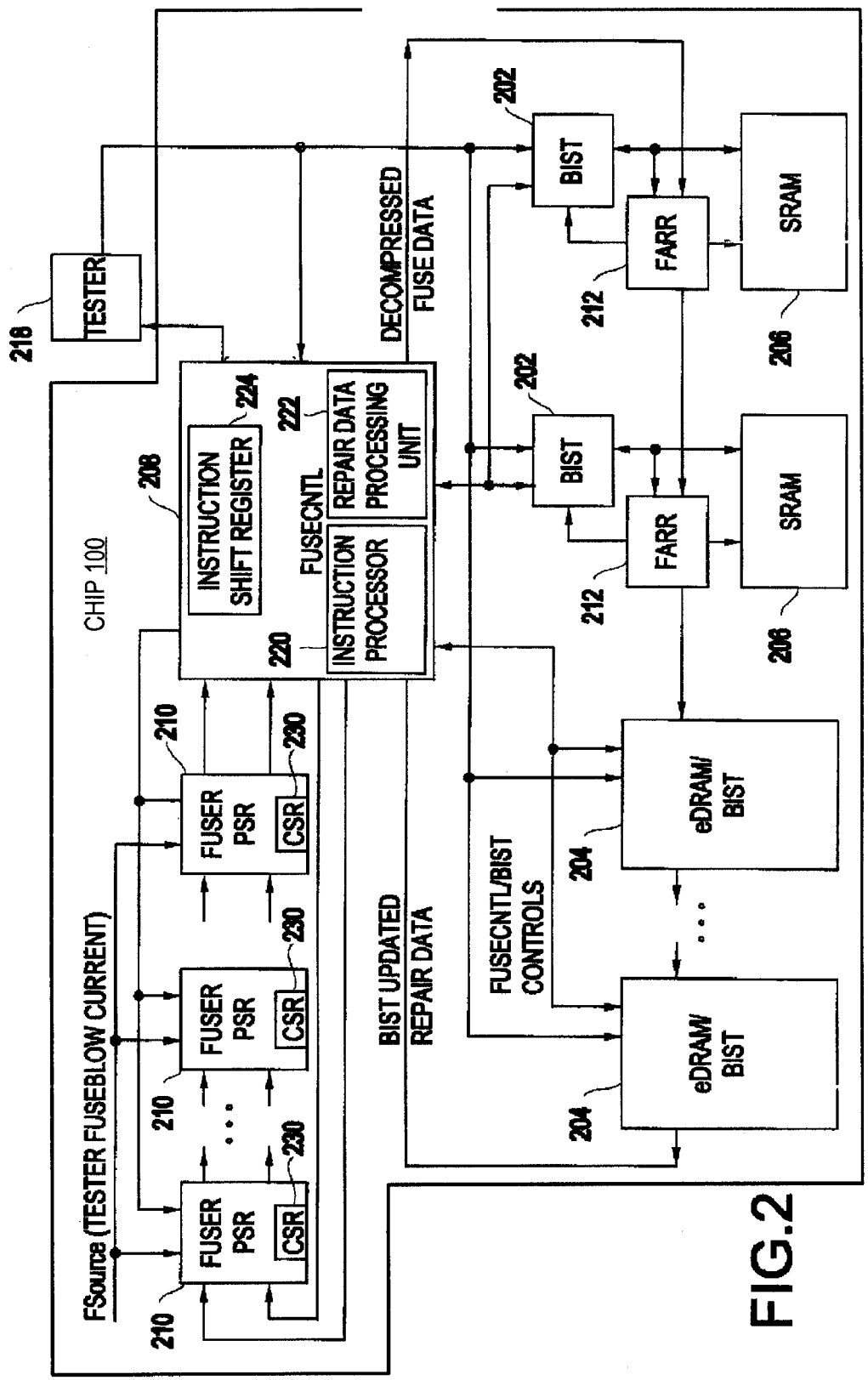
FIG. 2 is a block diagram of a integrated circuitry chip, including a fuse controller and e-fuses, such as the e-fuses of FIG. 1, included in a number of programmable shift registers, according to an embodiment of the present invention.

Referring now to FIG. 2, an arrangement of integrated circuitry on chip 100 is shown, according to an embodiment of the present invention. Chip 100 includes static random access memory ("SRAM") 206 and associated built-in self-test ("BIST") engines 202 (also referred to simply as "BIST" 202), and includes dynamic random access memory ("DRAM")/integral BIST 204. Groups of interconnected e-fuses 101 (FIG. 1C) are included in e-fuse programmable shift registers ("PSR's") 210. For example, according to one embodiment of the invention, three hundred eighty four e-fuses 101 are included in each PSR 201. The number of PSR's 210 on chip 100 depends on how many memories 204 and 206 are on chip 100. That is, if chip 100 has more memory, more PSR's 210 are required.

A fuse controller ("FUSECNTL") 208 arbitrates control among BIST 202 and 204 and performs "on system" tasks used to unload, load and program the e-fuses of PSR's 210. Fuse controller 208 routes BIST-collected repair data from failing address and repair registers (FARR) 212 in the memories 206 to the PSR's 210 prior to fuse programming. (FARR's for DRAM/BIST 204 are included therein.) The controller 208 also routes repair data from the PSR's 210 to the repair registers 212 of the memories 206 prior to running BIST or prior to system memory operation.

Figure 3:
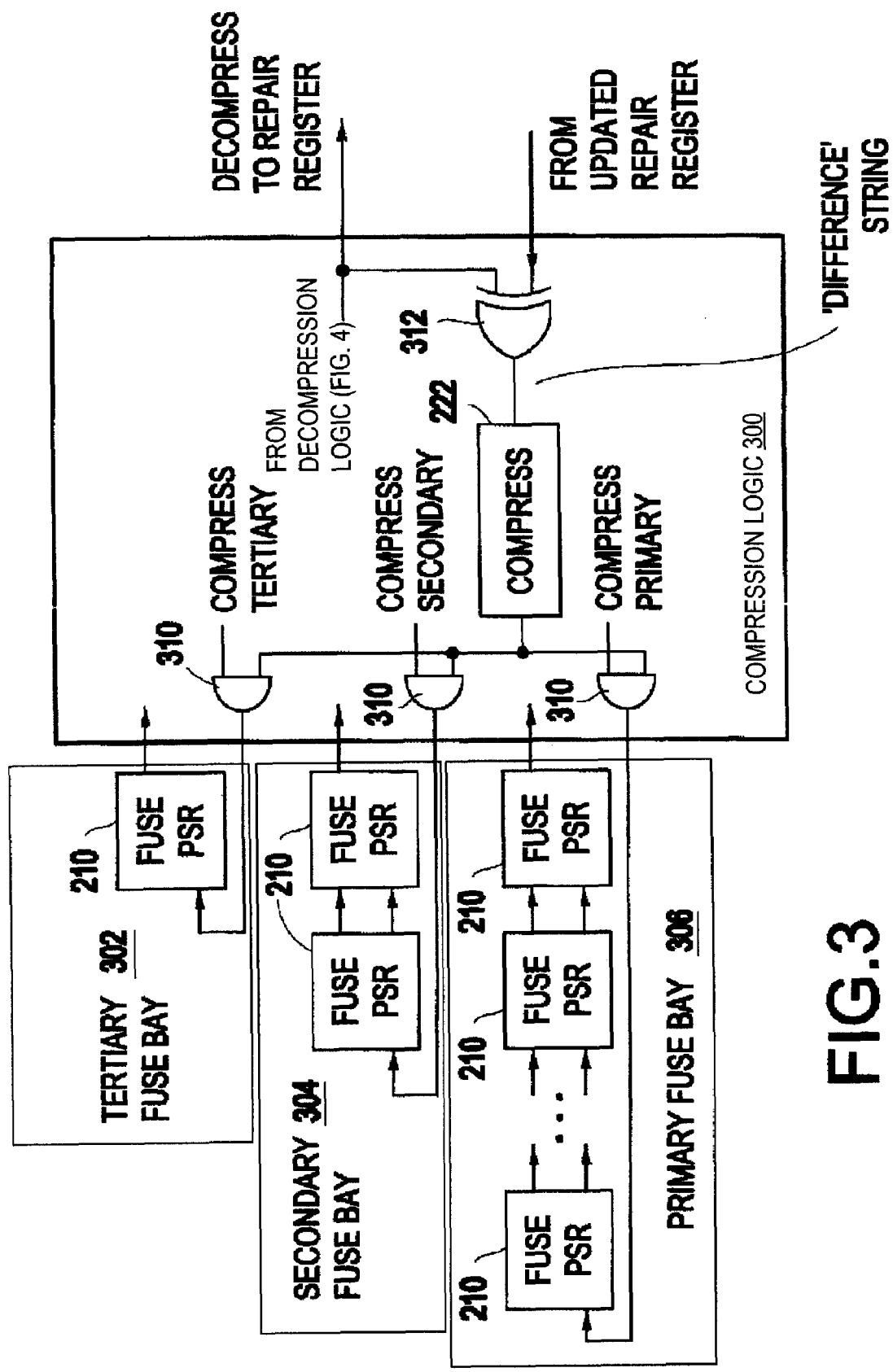
FIG. 3 is a block diagram illustrating the programmable shift registers and certain compression components of the fuse controller of FIG. 2, according to an embodiment of the present invention.

In order to perform on-chip repair, a complete redundancy solution is generated, according to which all BIST engines 202 and 204 are run prior to e-fuse, i.e., PSR 210, programming. Before a BIST engine 202 or 205 is run, it is provided access to previously stored results or is initialized so that it has a valid starting point. The BIST engines 202 and 204 are also capable of collecting repair solutions in multiple test iterations, adding additional repair aspects to a previously collected repair solution. When not collecting repair data, the BIST engines 202 and 204 are disabled such that they do not modify the most recent repair data. As shown in FIG. 3, fuse bays 302, 304 and 306 are used for storing repair solutions. Fuse bays 302, 304 and 306 each include a number of PSR's 210 daisy chained together, as described herein above. The primary fuse bay 306 is used to program a first pass test's repair data, while the secondary 304 and tertiary 302 fuse bays are used to implement second and third pass tests' repair data, respectively. Since most defects are found in a first pass test, the primary fuse bay 306 is significantly larger than secondary 304 and tertiary 302 fuse bays. The third pass test tends to find the fewest defects, so that the tertiary fuse bay 302 is the smallest.

Referring now to FIG. 2 in connection with FIG. 3, each of fuse bays 302, 304 and 306 is considered to contain valid repair data, if and only if, a fuse for a first bit, known as the "fused" bit, is programmed to a logical "1." For primary fuse bay 302, a next set of fuses contain bits for a count of total number of latches from a failing address and repair register 212. This number is acquired and stored by the controller 208 and is only programmed in primary fuse bay 302. The length of repair register 212 is needed by the controller 208 so that repair data may be properly shifted into and out of the repair register. The remaining fuses in primary fuse bay 302 contain first pass test compressed repair data. For secondary and tertiary fuse bays 304 and 306, the fuses following their respective fuses for their "fused" bit contain compressed modifications to the repair data of primary fuse bay 302.

Controller 208 has a generic interface protocol for tester 218, independent of the customer's ASIC design. Under normal system operation and during test, controller 208 controls reading, shifting and decompressing programmed repair data from fuse bays 302, 304 and 306 into repair registers of memories of memories 204 and 206. During test, controller 208 is additionally enables and controls appropriate BIST engines 202, 204 at the correct time, shifts and compresses BIST-updated repair data from repair registers of memories 204 and 206 to appropriate fuse bays 203, 304 and 306, controls fuse programming, and verifies that fuses are correctly programmed.

Each of these steps is controlled by external tester 218, which provides appropriate instructions to controller 208 through a serial access port 214. For each instruction issued to controller 208, a status pin 216 is made available by controller 208 for tester 218 to observe. This status pin 216 is asserted at successful completion of each instruction. If no assertion occurs after some predefined number of clock cycles, this indicates that an error occurred in that step or that it is not possible to generate a repair solution for this chip. Based on the state of status pin 216, tester 218 can respond appropriately by either continuing testing or aborting and moving to the next chip and continuing testing.

Controller 208 includes an instruction processor 220 and a repair data processing unit 222. The instruction processor 220 controls the various steps by decoding instructions issued from the tester 218. Repair data processing unit 222 contains compression logic 300 (FIG. 3) and decompression logic 400 (FIG. 4).

Repair data from BIST-updated repair register 212 is shifted through an exclusive-or gate 312 to repair data processing unit 222, where it is compared with a decompressed version of currently programmed fuse data, producing a "difference" serial string (like string 112 of FIG. 1A). This difference string is compressed into a compressed string (like string 114 of FIG. 1A), and shifted into a selected one of fuse bays 302, 304 or 306 through AND gates 310 for the appropriate level of repair.

At first pass wafer final test, the currently programmed repair solution is initially all zeroes, so that the production of difference string (like string 112 of FIG. 1A) by exclusive-or gate 312 does not change BIST-updated repair register data. The unchanged repair register data is then compressed into a compressed string (like string 114 of FIG. 1A) and shifted to primary fuse bay 306.

Figure 4:
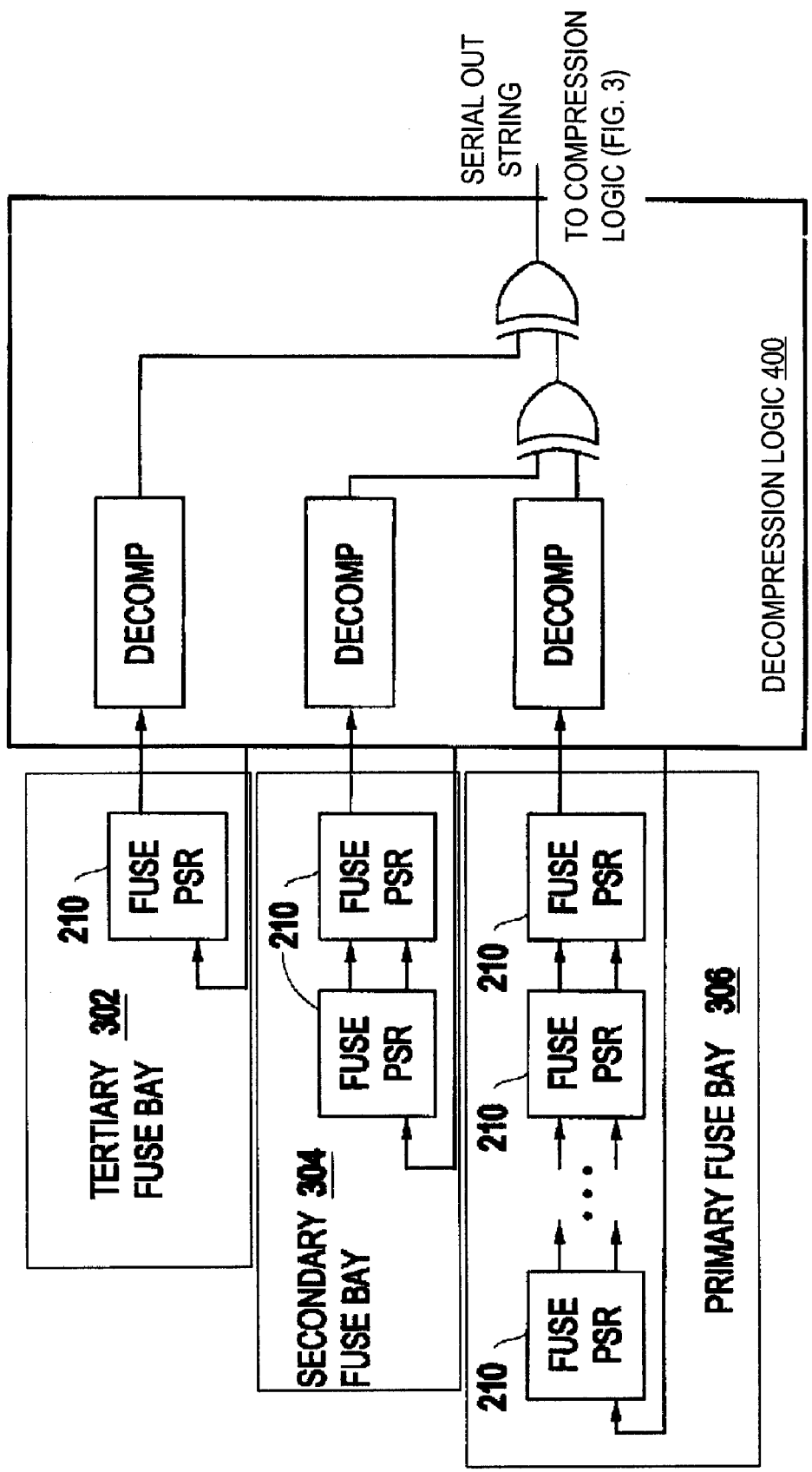
FIG. 4 is a block diagram illustrating the programmable shift registers and certain decompression components of the fuse controller of FIG. 2, according to an embodiment of the present invention.

FIG. 4 shows decompression logic 400 of repair data processing unit 222 (FIG. 2) of controller 208 (FIG. 2). Fuse data from all three fuse bays 302, 304 and 306 is decompressed and combined into a single serial string, then shifted to repair registers of memories 204 and 206n (FIG. 2).

Processor 220 (FIG. 2) of fuse controller 208 controls operations in response to program instructions that may be sent to processor 220 by tester 218 (FIG. 2). That is, the instructions are for accomplishing logic operations described herein, including logic shown in FIGS. 5A and 5B.

Figure 5A:
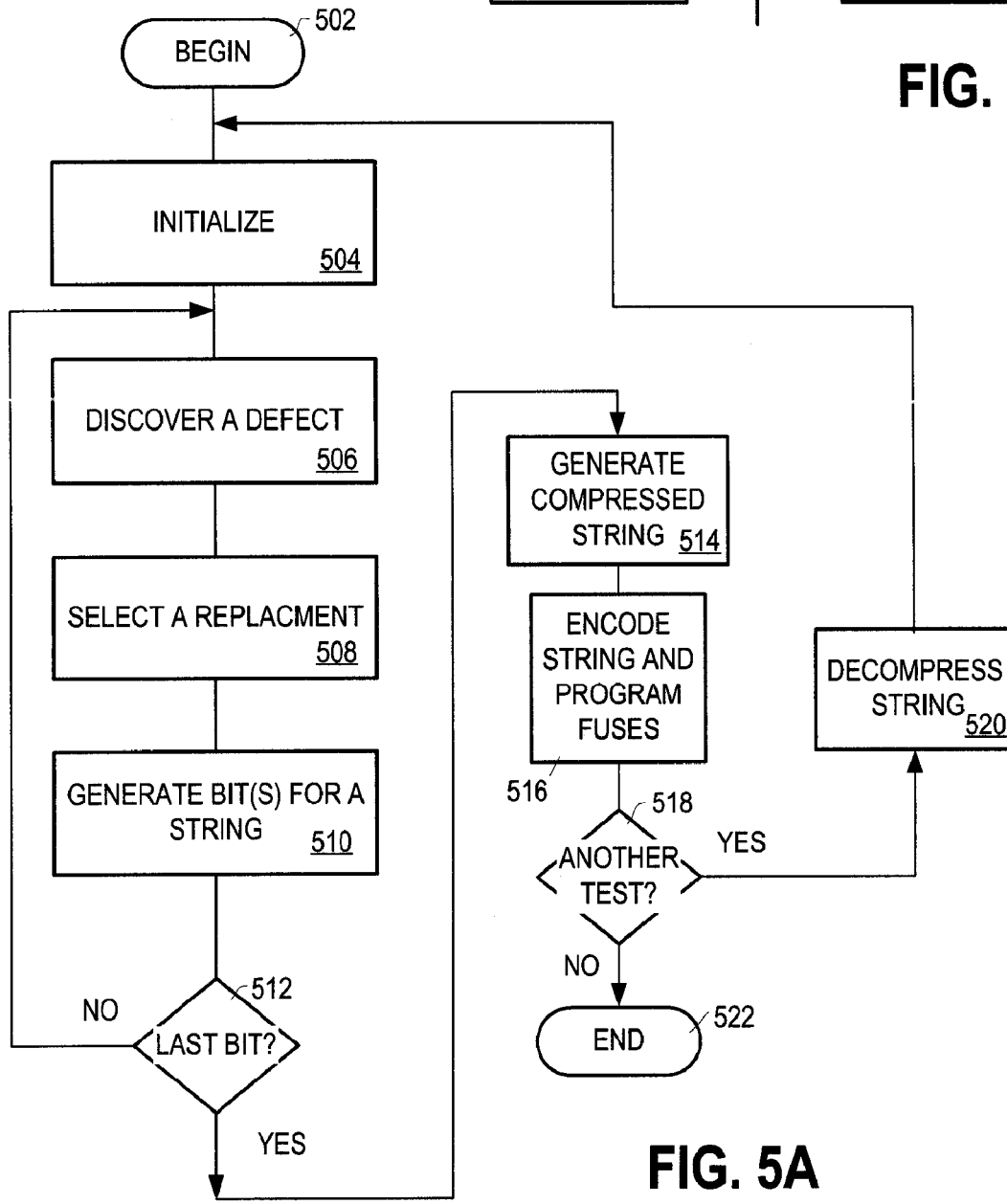
FIG. 5A is a flowchart illustrating certain operations performed by the fuse controller to discover and replace defective memory, according to an embodiment of the present invention.

Referring now to FIG. 5A, a flowchart is shown illustrating certain logic operations performed by the fuse controller 208 (FIG. 2) to discover and replace defective memory, which includes programming fuses to provide a nonvolatile record of which spare memory replaces which defective memory, according to an embodiment of the present invention. The flow chart of FIG. 5A begins at 502, after which logical initialization occurs at 504. Next, at 506 tests are performed to discover a defective memory element. Then, at 508, a spare memory element is selected to replace the defective memory element. At bit (or bits) for 510 a binary string is (are) generated, indicating which memory element has been replaced with which spare memory element. Then, at 512, it is determined whether all the bits have been generated, i.e., all memory elements have been tested. If so, then at 514 a compressed string is generated. Then, at 516, the string may be encoded and the fuses are programmed, as will be described further in connection with FIG. 5B herein. (If all the memory elements have not yet been tested and all bits generated, then the logic returns to block 506 for more testing.) After fuse programming at 516, it is determined at 518 whether another test is to be performed. If so, then logic operations depicted in FIG. 5A end at 522. If not, then the compressed string, i.e., the string programmed into the fuses, is decompressed at 520, for use in updating the binary string after new tests, and the logic continues to block 504 again.

Figures 5B, 6:
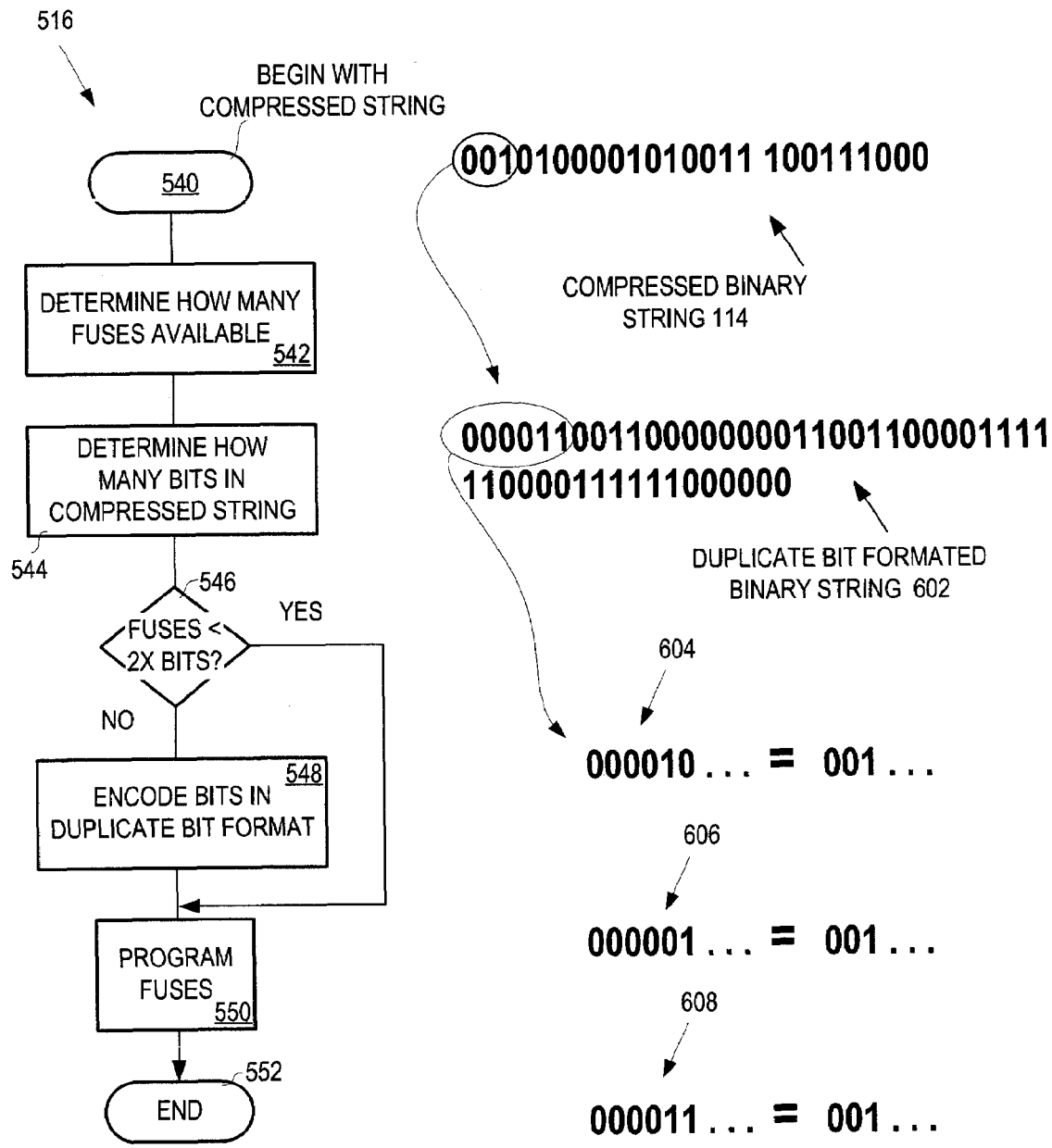
FIG. 5B is a flowchart illustrating certain operations performed by the fuse controller to increase fuse programming yield through preferred use of duplicate data, according to an embodiment of the present invention.
FIG. 6 illustrates details of duplicate bit encoding and decoding, according to an embodiment of the present invention.

Referring now to FIG. 5B, a flowchart is shown illustrating details of logic operations of block 516 in FIG. 5A. These operations are performed by the fuse controller 208 (FIG. 2) to increase fuse programming yield through preferred use of duplicate data, according to an embodiment of the present invention. The flow chart of FIG. 5B begins at 540, after which it is determined at 542 how many fuses are available. Then, at 544 it is determined how many bits are in the compressed string that is to be programmed into the fuses. At 546 the number of fuses available are compared to the number of bits in the string to be programmed into the fuses. If two fuses are available for each of the bits of the string, then at 548 encoding mode is set to duplicate-bit format for recording of the string. In one embodiment, this includes programming a logical "1" in a fuse that is designated to indicate the format selected. The duplicate-bit format will be described herein below. Next, at 552, the fuses are programmed, either in duplicate bit format, or as a literal copy of the compressed string, as determined by the comparison made at 546. At 554, the logic operations depicted in FIG. 5B end. In one embodiment of the invention, if duplicate bit mode is selected, the entire string is encoded in duplicate bit format before the fuses are programmed. In another embodiment of the invention, the string is encoded into duplicate bit format bit-by-bit concurrently with programming of the fuses.

Also, in an alternative embodiment of the invention, not only is the programming of the fuses done after the compressed string is encoded into duplicate bit format, but even the determination of whether the fuses will be recorded in duplicate bit format, i.e., determination by logic similar to block 546 in FIG. 5B, is deferred until after the string has been duplicate bit encoded. In this alternative embodiment, since the bits of the compressed string have already been doubled, the comparison merely determines whether the number of bits is equal to number of available fuses. If, in this alternative embodiment, there are not sufficient fuses available to record in duplicate bit format, then the string is re-encoded into the form it had before the duplicate bit encoding was performed, and then the string is recorded in the fuses.

In the description of FIG. 3 above, it was explained that primary fuse bay 306 is used to program a first pass test's repair data, while secondary 304 and tertiary 302 fuse bays are used to implement second and third pass tests' repair data, respectively. As shown in FIG. 5B above for an embodiment of the invention, the fuse controller selects the recording format for recording the compressed binary string in primary fuse bay 306 (FIG. 3). In an embodiment of the invention, the fuse controller also selects that same format for recording in secondary 304 and tertiary 302 fuse bays.

This simplification in logic is used because, due to the systematic nature of defects in deep-submicron technology, if primary fuse bay 306 has enough fuses for the first pass repair data, it is very likely that the number of fuses in secondary 304 and tertiary 302 fuse bays will be sufficient for second and third pass repair data.

Referring now to FIG. 6, details of the duplicate bit encoding operation of logic block 548 in FIG. 5B are described, according to an embodiment of the present invention. FIG. 6 also serves to illustrate decoding of the state of fuses that have been duplicate-bit-encoded.

A compressed binary string 114 is shown, which has twenty-five bits. (This is the same compressed string 114 depicted in FIG. 1D, which arose from the uncompressed string 112 depicted in FIG. 1B, which arose from discovering that two memory elements 102 (FIG. 1B) were defective out of a total of sixty-four memory elements 102.) If at least fifty fuses are available on the chip 100 (FIGS. 2, 3 and 4) for programming to record the twenty-five bits of string 114, then the string 114 may be encoded in a duplicate bit format.

From the above it should be appreciated that although two of the memory elements on chip 100 are determined to be defective, which determines the number of string 114 bits, nevertheless, the number of fuses (such as fuses 101.1 (FIG. 1E)) to program on the chip 100 is determined in response to how many fuses are available for programming relative to the number of bits of string 114. That is, in the embodiment of the invention described immediately above it is desired that the number of fuses are available is at least twice the number of string 114 bits. If so, then that number of fuses are programmed. But if not, then only the same number of fuses as string 114 bits are programmed. Thus, even given two cases in which the number of binary bits to be recorded by the fuses is the same, in one case in which more fuses are available, the number of fuses programmed will be more, and, in another case in which less fuses are available, the number programmed will be less.

To encode a bit in duplicate bit format, a bit is repeated. To encode an entire string, such as string 114, in duplicate bit format, each bit of string 114 is repeated. This is accomplished by merely recording (i.e., more correctly stated, attempting to record) each bit of string 114 in two fuses in sequence. That is, if a bit of string 114 has a value of "1," a programming current is applied to blow two sequential fuses, which is intended to record this single bit as two "1's." Likewise, if a bit of string 114 has a value of "0," no programming current is applied to two sequential fuses, which records this bit as two "0's." Thus, after twenty-five bits are recorded in fifty fuses in this manner, the sequence of fifty fuses will have the value shown for string 602, provided that every fuse is successfully programmed as intended.

Note, for example, the first three bits of string 114 in FIG. 6, "001," are encoded to six bits of string 602, "000011," as shown, and three possible states of the corresponding six programmed fuses are shown below string 602, two of them being unintended states. That is, the final two fuses in a sequence of six are intended to be blown to represent the ending bits "11" in the string segment "000011." But in one of the possible states represented, state 604, the programming of the final fuse in the sequence is not successful, i.e., the fuse does not blow as intended, so that the actual state of the string of fuses is "000010." And in another one of the possible states represented, state 606, the programming of the next-to-last fuse in the sequence is not successful, i.e., the fuse does not blow as intended, so that the actual state of the string of fuses is "000001." Finally, in the last one of the possible states represented, state 608, the programming is successful for both of the last two fuses in the sequence, so that the actual state of the string of fuses actually is "000011."

In another aspect of the present invention, there is a particular manner of interpreting states of programmed fuses. First, before bits of a string are read from the fuses, the format in which the bits were recorded must be determined. To do this, the format indication fuse is read. If that fuse indicates duplicate-bit encoding, it is understood that pairs of fuses represent respective string bits. In this case, in reading the recorded string back out of the fuses a pair of duplicate-bit-encoded fuses that represent a single bit are read as a single bit.

It follows from the encoding method described herein above that a sequence of the two duplicate-bit-encoded fuses that represent a single bit are in a sequence that begins with an odd numbered one of the fuses. If the states of such a pair of fuses are determined to be "10," such as the states of the fifth and sixth fuses depicted in state 604, this is deemed to represent a "1" state for a single bit, as shown. Likewise, if the states are "01," such as depicted in state 606, this is also deemed to represent a "1" state. Of course, if the states are "11," such as depicted in state 608, this represents a "1" state. In this manner, even if one out of two fuses is does not change state as intended when programmed, when the combination of the two fuses is read their single-bit representation is advantageously interpreted as a "1" state. Thus, the fuse programming is fault tolerant. This increases chip yield in the manufacturing and test process, since without this fault tolerant arrangement a fuse that failed to change state as intended when programmed would cause its chip to malfunction when tested, so that the chip would be rejected.

Figure 7:
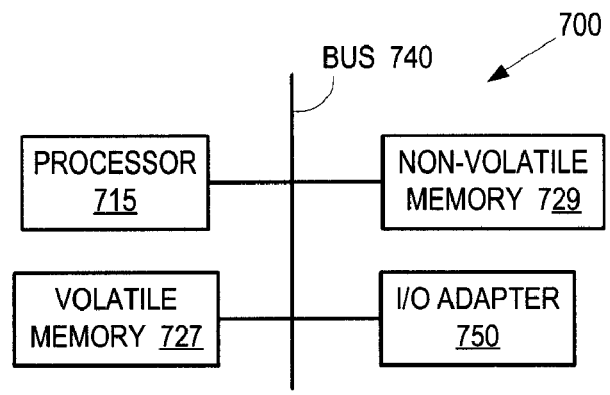
FIG. 7 illustrates a microprocessor for the fuse controller of FIG. 2, according to an embodiment of the present invention.

Referring now to FIG. 7, a microcontroller 700 is illustrated, according to an embodiment of the invention. Microcontroller 700 may be used to implement fuse controller 208 of FIG. 2, or certain functions thereof, such as instruction processor 220, for example. Microcontroller 700 includes a processor 715, a volatile memory 727, e.g., RAM and a nonvolatile memory 729, e.g., ROM. Memory 727 and 729 store program instructions (also known as a "software program"), which are executable by microcontroller 715, to implement various embodiments of a software program in accordance with the present invention. Processor 715 and memories 727 and 729 are interconnected by bus 740. An input/output adapter 750 is also connected to bus 740 to enable information exchange between processor 715 and other devices or circuitry, such as tester 218, FUSE PSR's 210, DRAM/BIST 204, BIST 202, etc. (FIG. 2).

It should be appreciated from the foregoing that e-fuses enable development of on-chip repair, wherein at the conclusion of test, compressed repair data is stored in a nonvolatile manner. This may include multiple repairs after varying test conditions, or even after test of the packaged chip. Further, in the arrangement described, memory test, repair data calculation and e-fuse programming can occur in a single test contact without data ever leaving the chip. Also, selectively programming of e-fuses in a duplicate data format, as described herein, can allow for enhanced yield of packaged chips, while still permitting efficient usage of e-fuses.

The description of the present embodiment has been presented for purposes of illustration, but is not intended to be exhaustive or to limit the invention to the form disclosed. Many modifications and variations will be apparent to those of ordinary skill in the art. For example, while e-fuses have been described herein as polysilicon links, different materials are within the intended scope of the invention. While flowcharts, descriptions and claims herein have described operations in certain sequences, the sequences are not necessarily intended to be limited to those described, unless a fixed sequence is stated or is implied in its context.

According to duplicate bit encoding method described herein above, two fuses are programmed to represent a single bit, where the two fuses are sequential, i.e., physically adjacent, beginning with an odd numbered one of the fuses. However, it should be understood the duplicate bit encoding method is not necessarily limited to this arrangement. Two fuses that are not adjacent may be selected for encoding to represent a single bit.

Herein above, it has been stated that an e-fuse is programmed to obtain a logical "1" state by applying a pulse of current to increase the fuse's resistance, and that the e-fuse is not subjected to such a programming current in order to obtain a relatively lower resistance, logical "0" state. However, it should be understood the logical state associated with a physical state is arbitrary. That is, a high resistance fuse may be considered a logical "0," and a low resistance fuse may be considered a logical "1." Also, it should be understood that it is not intended that the invention necessarily be limited to programming fuses only by means of an electrical current. For example, a fuse may be programmed by subjecting it to some other energy, such from as a laser. Also, in the claims that follow, it should be understood that "recording" a bit of a string in a fuse refers to fixing the fuse in one of two detectable, physical states. Recording a bit may include selecting to not change the fuse's physical state, such as, for example, not subjecting the fuse to an electrical current.

Note that in an embodiment of the invention described above, there must be twice as many available fuses as the number of compressed string bits in order to record the bits in duplicate bit format in the fuses. There are other embodiments of the invention in which the threshold number of fuses may be different. For example, in another embodiment of the invention, for each available fuse exceeding the number of compressed string bits, one pair of fuses is programmed in duplicate bit format for each one of the "1" bits in the string. That is, if it is determined that there are at least two of the fuses available for recording one of the bits of the binary string, but not enough fuses to record all of the bits in this manner, at least that one bit is recorded in two fuses.

To reiterate, the embodiments were chosen and described in order to best explain the principles of the invention, the practical application, and to enable others of ordinary skill in the art to understand the invention. Various other embodiments having various modifications may be suited to a particular use contemplated, but may be within the scope of the present invention.

What is claimed is:

1. A method for programming fuses to replace defective memory elements of an integrated circuit, wherein the integrated circuit includes spare memory elements, the method comprising:
   a) performing a test of certain memory elements of an integrated circuit to discover defective memory elements;
   b) selecting ones of the spare memory elements to replace ones of the defective memory elements;
   c) generating a binary string indicating which ones of the spare memory elements have been selected for replacing which ones of the defective memory elements, wherein the string has a number of bits, the number being dependent upon how many of the certain memory elements are defective;
   d) determining how many fuses on the integrated circuit are available for providing a record of the string; and
   e) recording the string in a number of the fuses responsive to the number of bits in the string and how many fuses are available, wherein responsive to determining availability of more than a certain threshold number of available fuses relative to the number of string bits, the string is recorded in more than the threshold number of fuses.

2. The method of claim 1, wherein responsive to determining availability of less fuses than the certain threshold number relative to the number of string bits, the string is recorded in step e) in only the certain threshold number of fuses.

3. The method of claim 1, wherein the determining of availability of more than a certain threshold number of available fuses relative to the number of string bits determines that at least twice as many of the fuses are available as the number of bits of the string, and wherein each bit of the binary string is recorded in step e) in two fuses.

4. The method of claim 2, wherein the determining of availability of less fuses than the certain threshold number relative to the number of string bits determines that less than twice as many of the fuses are available as the number of bits of the string, and wherein each bit of the binary string is recorded in step e) in one fuse.

5. The method of claim 1, wherein the determining of availability determines that there are at least two of the fuses available for recording one of the bits of the binary string, and wherein in step e) that one bit is recorded in two fuses.

6. The method of claim 2, wherein the determining of availability determines that there is only one of the fuses available for one of the bits of the binary string, and wherein in step e) that one bit is recorded in one fuse.

7. The method of claim 1, wherein the string generated in step c) is a compressed binary string and the generating in step c) includes compressing a certain uncompressed binary string.

8. The method of claim 3, wherein step e) includes recording a format indication, and wherein the method includes:
   reading the recorded string from the fuses, wherein for a certain format, even if only one of two fuses for a bit of the string has a certain state, the bit is read as having that certain state.

9. The method of claim 3, wherein step e) includes recording a format indication, and wherein the method includes:
   reading the recorded string from the fuses, wherein for a certain format, even if only one of two fuses for a bit of the string has a logical "1" state, the bit is read as having the logical "1" state.

10. A method for programming fuses to replace defective memory elements of an integrated circuit, wherein the integrated circuit includes spare memory elements, the method comprising:
   a) performing a test of certain memory elements of an integrated circuit to discover defective memory elements;
   b) selecting ones of the spare memory elements to replace ones of the defective memory elements;
   c) generating a binary string indicating which ones of the spare memory elements have been selected for replacing which ones of the defective memory elements, wherein the string has a number of bits, the number being dependent upon how many of the certain memory elements are defective;

d) determining how many fuses on the integrated circuit are available for providing a record of the string;

e) recording the string in a number of the fuses responsive to the number of bits in the string and how many fuses are available, wherein responsive to determining that at least twice as many of the fuses are available as the number of bits of the string, a format indication is recorded to indicate a duplicate-bit format and each bit of the binary string is recorded in two fuses, and responsive to determining that less than twice as many of the fuses are available as the number of bits of the string, the format indication is recorded to indicate a single-bit format and each bit of the binary string is recorded in one fuse; and f) reading the string recorded in the fuses and the format indication, wherein if the single-bit format is indicated, then one fuse is read for each respective bit of the string such that if a fuse for a bit has a high resistance state the bit is read as having a first logical state and if the fuse for a bit has a low resistance state the bit is read as having a second logical state, and wherein if the duplicate-bit format is indicated, then two fuses are read for each bit of the string such that even if only one of the two fuses for a bit has a high resistance state, the bit is read as having the first logical state.

11. The method of claim 10, wherein in step c) the generated string is a compressed binary string and the generating includes compressing a certain uncompressed binary string.

12. An apparatus comprising:
memory elements;
test circuitry for performing a test of the memory elements to discover defective ones of the memory elements;
spare memory elements for replacing the defective memory elements;
programmable fuses; and
a fuse controller for selecting ones of the spare memory elements to replace ones of the defective memory elements and generating a binary string indicating which ones of the spare memory elements have been selected for replacing which ones of the defective memory elements, wherein the string has a number of bits, the number being dependent upon how many of the certain memory elements are defective, wherein the fuse controller determines how many fuses on the integrated circuit are available for providing a record of the string, and records the string in a number of the fuses responsive to the number of bits in the string and how many fuses are available, wherein responsive to determining availability of more than a certain threshold number of available fuses relative to the number of string bits, the string is recorded in more than the threshold number of fuses.

13. The apparatus of claim 12, wherein responsive to determining availability of less fuses than the certain threshold number relative to the number of string bits, the fuse controller records the string in only the certain threshold number of fuses.

14. The apparatus of claim 12, wherein responsive to determining that at least twice as many of the fuses are available as the number of bits of the string, the fuse controller records each bit of the string in two fuses.

15. The apparatus of claim 13, wherein responsive to determining that less than twice as many of the fuses are available as the number of bits of the string, the fuse controller records each bit of the string in one fuse.

16. The apparatus of claim 12, wherein responsive to determining that there are at least two of the fuses available for recording one of the bits of the string, the fuse controller records one bit in two fuses.

17. The apparatus of claim 13, wherein responsive to determining that there is only one of the fuses available for one of the bits of the string, the fuse controller records that one bit in one fuse.

18. The apparatus of claim 12, wherein the generated string is a compressed string and the fuse controller compresses a certain uncompressed string to generate the compressed string.

19. The apparatus of claim 12, wherein the fuse controller records a format indication and controls reading of the recorded string from the fuses, wherein for a certain format, even if only one of two fuses for a bit of the string has a certain state, the bit is read as having that certain state.

20. The apparatus of claim 12, wherein the fuse controller records a format indication, and controls reading of the recorded string from the fuses, wherein for a certain format, even if only one of two fuses for a bit of the string has a logical "1" state, the bit is read as having the logical "1" state.

21. The apparatus of claim 12, wherein the generated string is a compressed string, wherein responsive to determining that less than twice as many of the fuses are available as the number of bits of the string, the fuse controller records a first format indication and records each bit of the string in one fuse, wherein responsive to determining that at least twice as many of the fuses are available as the number of bits of the string, the fuse controller records a second format indication and records each bit of the string in two fuses, wherein the fuse controller controls reading of the recorded string from the fuses, and wherein for the second format, even if only one of two fuses for a bit of the string has a logical "1" state, the bit is read as having the logical "1" state.

22. A computer program product for programming fuses to replace defective memory elements, wherein the computer program product resides on a computer usable medium having computer readable program code, the program code comprising:
first instructions for performing a test of certain memory elements of an integrated circuit to discover defective memory elements;
second instructions for selecting ones of the spare memory elements to replace ones of the defective memory elements;
third instructions for generating a binary string indicating which ones of the spare memory elements have been selected for replacing which ones of the defective memory elements, wherein the string has a number of bits, the number being dependent upon how many of the certain memory elements are defective;
fourth instructions for determining how many fuses on the integrated circuit are available for providing a record of the string; and
fifth instructions for recording the string in a number of the fuses responsive to the number of bits in the string and how many fuses are available, wherein responsive to determining availability of more than a certain threshold number of available fuses relative to the number of string bits, the string is recorded in more than the threshold number of fuses.

23. The computer program product of claim 22, wherein the fifth instructions include instructions for recording the string in only the certain threshold number of fuses responsive to determining availability of less fuses than the certain threshold number relative to the number of string bits.

24. The computer program product of claim 22, wherein the fifth instructions include instructions for recording each bit of the string in two fuses if the determining of availability determines that at least twice as many of the fuses are available as the number of bits of the string, and wherein.

25. The computer program product of claim 23, wherein the fifth instructions include instructions for recording each bit of the string in one fuse if the determining of availability determines that less than twice as many of the fuses are available as the number of bits of the string.

26. The computer program product of claim 22, wherein the fifth instructions include instructions for recording one bit in two fuses if the determining of availability determines that there are at least two of the fuses available for recording one of the bits of the string.

27. The computer program product of claim 23, wherein the fifth instructions include instructions for recording one bit in one fuse if the determining of availability determines that there is only one of the fuses available for one of the bits of the string.

28. The computer program product of claim 22, wherein the string generated by the third instructions is a compressed string and the third instructions include instructions for compressing a certain uncompressed string.

29. The computer program product of claim 22, wherein the fifth instructions include instructions for recording a format indication, and wherein the computer program product includes:

sixth instructions for reading the recorded string from the fuses, wherein for a certain format, even if only one of two fuses for a bit of the string has a certain state, the bit is read as having that certain state.

30. The computer program product of claim 22, wherein the fifth instructions include instructions for recording a format indication, and wherein the computer program product includes:

sixth instructions for reading the recorded string from the fuses, wherein for a certain format, even if only one of two fuses for a bit of the string has a logical "1" state, the bit is read as having the logical "1" state.

* * * * *

UNITED STATES PATENT AND TRADEMARK OFFICE
CERTIFICATE OF CORRECTION

PATENT NO. : 7,251,756 B2
APPLICATION NO. : 10/908033
DATED : July 31, 2007
INVENTOR(S) : Darren Lane Anand, Michael Richard Ouellette and Michael Anthony Ziegerhofer It is certified that error appears in the above-identified patent and that said Letters Patent is hereby corrected as shown below:

The 26th line of column 5 , as the specification is set out in the printed patent, which reads "... to a number of bits = 6 + (6 / number of defective memory elements 110)."
should read
-- ... to a number of bits = 6 + (6 * number of defective memory elements 110). --

The 67th line of column 5 , as the specification is set out in the printed patent, which reads "...the third through seventh bit of the set 116 ..."
should read
-- ...the second through seventh bit of the set 116 ... --

The 3rd line of column 6 , as the specification is set out in the printed patent, which reads "...the third through seventh bit of the set 116 ..."
should read
-- ...the second through seventh bit of the set 116 ... --

The 21st line of column 6 , as the specification is set out in the printed patent, which reads "...a third set 118 of eight bits..."
should read
-- ...a third set 118 of seven bits... --

The 31st line of column 6 , as the specification is set out in the printed patent, which reads "... to a number of bits = 1 + (8 / number of defective memory elements 110)."
should read
-- ... to a number of bits = 1 + (8 * number of defective memory elements 110). --

The 36th line of column 6 , as the specification is set out in the printed patent, which reads "... to a number of bits = 1 + (8 / number of defective memory elements 110)."
should read
-- ... to a number of bits = 1 + (8 * number of defective memory elements 110). --

The 11th line of column 10 , as the specification is set out in the printed patent, which reads "If so, then logic operations depicted in..."
should read
--If not, then logic operations depicted in... --

UNITED STATES PATENT AND TRADEMARK OFFICE
CERTIFICATE OF CORRECTION

PATENT NO. : 7,251,756 B2
APPLICATION NO. : 10/908033
DATED : July 31, 2007
INVENTOR(S) : Darren Lane Anand, Michael Richard Ouellette and Michael Anthony Ziegerhofer It is certified that error appears in the above-identified patent and that said Letters Patent is hereby corrected as shown below:

The 12th line of column 10 , as the specification is set out in the printed patent, which reads "If not, then the compressed string..."
should read
-- If so, then the compressed string... --

Signed and Sealed this

Thirtieth Day of October, 2007

JON W. DUDAS
*Director of the United States Patent and Trademark Office*